US010705157B2

(12) United States Patent
Amarasinghe et al.

(10) Patent No.: US 10,705,157 B2
(45) Date of Patent: Jul. 7, 2020

(54) TESTING SYSTEM FOR AN ELECTRICAL CABLE

(71) Applicant: Microsoft Technology Licensing, LLC, Redmond, WA (US)

(72) Inventors: Saluka Abhishek Amarasinghe, Seattle, WA (US); Christopher John Allen, Seattle, WA (US); Edward Charles Giaimo, III, Bellevue, WA (US); Sanketkumar Natvarbhai Patel, Kirkland, WA (US); Attila Major, Woodinville, WA (US); Andrew Smith Taber, Seattle, WA (US); Wei Guo, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 353 days.

(21) Appl. No.: 15/672,979

(22) Filed: Aug. 9, 2017

(65) Prior Publication Data
US 2019/0049504 A1 Feb. 14, 2019

(51) Int. Cl.
G01R 31/58 (2020.01)
G01R 31/08 (2020.01)
H04B 3/46 (2015.01)
H04B 3/54 (2006.01)
G01R 31/50 (2020.01)

(52) U.S. Cl.
CPC ............ *G01R 31/58* (2020.01); *G01R 31/08* (2013.01); *G01R 31/50* (2020.01); *H04B 3/46* (2013.01); *H04B 3/54* (2013.01)

(58) Field of Classification Search
CPC .... G01R 31/021; G01R 31/026; G01R 31/08; H04B 3/46; H04B 3/54

USPC .......................................................... 324/543
See application file for complete search history.

(56) References Cited

U.S. PATENT DOCUMENTS

| 4,471,293 | A | * | 9/1984 | Schnack | ............. | G01R 31/023 |
| | | | | | | 324/540 |
| 7,808,247 | B1 | * | 10/2010 | Lo | ........................ | G01R 31/021 |
| | | | | | | 324/533 |
| 2004/0066202 | A1 | * | 4/2004 | Pereira | ................. | G01R 31/021 |
| | | | | | | 324/539 |
| 2005/0149626 | A1 | * | 7/2005 | Manchester | ........ | H04L 41/0213 |
| | | | | | | 709/220 |

(Continued)

OTHER PUBLICATIONS

Texas Instruments; "LVDS Performance: Bit Error Rate (BER) Testing Test Report #2"; Pub. Date 2011; SNLA154 (Year: 2011).*

(Continued)

*Primary Examiner* — Melissa J Koval
*Assistant Examiner* — Rahul Maini
(74) *Attorney, Agent, or Firm* — Ray Quinney & Nebeker, P.C.; Thomas M. Hardman; Matthew M. Walker

(57) ABSTRACT

A testing system may include an electrical cable, a computing device, a communication interface, at least one downstream device, and testing software. The communication interface may be coupled to the electrical cable and to the computing device. The at least one downstream device may be coupled to the electrical cable. The testing software may be stored on the computing device. The testing software may be configured to initiate and evaluate transfer of data between the computing device and the at least one downstream device through the electrical cable and the communication interface.

16 Claims, 6 Drawing Sheets

(56) References Cited

U.S. PATENT DOCUMENTS

| | | | | |
|---|---|---|---|---|
| 2005/0237068 A1* | 10/2005 | Nakashita | ............... | H04B 3/56 324/539 |
| 2007/0143811 A1* | 6/2007 | Powell | .................... | H04B 3/20 725/127 |
| 2014/0258225 A1* | 9/2014 | Bovee | .................. | G06F 3/0607 707/613 |
| 2018/0192621 A1* | 7/2018 | Valatka | .................... | A01K 1/00 |

OTHER PUBLICATIONS

Cole; "LVDS Multidrop Connections"; Pub. Date Feb. 11, 2002; Texas Instruments; SLLA054A (Year: 2002).*

Dehmelt; "Performance of LVDS with different cables"; Aug. 2000; Texas Instruments; SLYT163 (Year: 2000).*

Ralston, et al., "Test and Verification of Micro Coaxial Line Power Performance", In Proceedings of IEEE MTT-S International Microwave Symposium Digest, Jun. 17, 2012, 3 pages.

"Test & Measurement Applications", Retrieved from «https://web.archive.org/web/20131119084807/https://www.micro-coax.com/markets/test-measurement-applications/», Nov. 19, 2013, 1 page.

"Micro-Coax Semi-Rigid Cable UT-141-100-TP", Retrieved from «https://web.archive.org/web/20140214021304/https://www.cdiweb.com/datasheets/micro-coax/UT-141-100-TP.pdf», Feb. 14, 2014, 3 pages.

"Fluke Networks", Retrieved from «http://www.flukenetworks.com/content/testing-coaxial-cabling-microscanner2», Published on: 2006, 3 pages.

"Coaxial Cable Assemblies", Retrieved from «http://www.bipom.com/ez_cable_assemblies.php», 1996, 1 page.

"High Speed Interconnects UFX Micro Coaxial Cable Loss Performance", Retrieved from «http://www.highspeedint.com/images/Resources/Test%20Report%20-%20UFX%20Coax%20Performance.pdf», 2012, 2 pages.

"Network Analyzer Cables, RF Calibration and Short Open Load Thru Accessories", Retrieved from «https://www.pastemack.com/network-analyzer-cables-calibration-and-accessories-category.aspx», 1999, 2 pages.

"For Cable Testing should I Use a Time Domain Reflectometer (TDR), A Network Analyzer, or Both?", Retrieved from «http://www.keysight.com/main/editorial.jspx?cc=IN&lc=eng&ckey=630801&nid=-32432.761694&id=630801», Retrieved on: Jun. 20, 2017, 1 page.

Resso, et al., "Signal Integrity Characterization Techniques", In Proceedings of International Engineering Consortium, 2009, 806 pages.

* cited by examiner

TESTING SYSTEM FOR AN ELECTRICAL CABLE

CROSS-REFERENCE TO RELATED APPLICATIONS

N/A

BACKGROUND

Computing devices affect nearly every aspect of modern living. There are many different types of computing devices in use today, including desktop computers, laptop computers, tablet computers, smartphones, virtual reality headsets, wearable computing technology, and the like.

Electrical cables are frequently used with computing devices. An electrical cable may include one or more conductors that may be used to carry electrical current. In a cable that includes multiple conductors, the cables may be bundled together. Each of the conductors may include its own insulation(s), protective covering(s), screen(s), etc.

Electrical cables may be used for a wide range of purposes. For example, in computing devices that include multiple circuit boards, electrical cables may be used to connect the circuit boards, enabling the transfer of electrical signals and/or power from one circuit board to the other. In some cases, electrical signals and/or power may be routed across one or more hinges. As another example, electrical cables may be used to connect two or more computing devices to each other, enabling the transfer of electrical signals or power from one device to the other. Some cables may be configured to facilitate data transfer at high speeds, while other cables may be configured for data transfer at slower speeds.

SUMMARY

In accordance with one aspect of the present disclosure, a testing system that includes an electrical cable, a computing device, a communication interface, at least one downstream device, and testing software is disclosed. The communication interface may be coupled to the electrical cable and to the computing device. The at least one downstream device may be coupled to the electrical cable. The testing software may be stored on the computing device. The testing software may be configured to initiate and evaluate transfer of data between the computing device and the at least one downstream device through the electrical cable and the communication interface.

The at least one downstream device may include a data reception module configured to receive the data from the computing device. The at least one downstream device may also include a data transmission module configured to send the data back to the computing device.

The testing system may further include at least one downstream signal degradation component coupled to the electrical cable and to the at least one downstream device. The testing system may also include at least one upstream signal degradation component coupled to the electrical cable and to the communication interface.

The testing software may be configured to initiate transfer of the data from the computing device to the at least one downstream device through the communication interface, the at least one upstream signal degradation component, the electrical cable, and the at least one downstream signal degradation component. The at least one downstream device may be configured to receive the data from the computing device and send the data back to the computing device through the at least one downstream signal degradation component, the electrical cable, the at least one upstream signal degradation component, and the communication interface.

The testing software may be configured to determine one or more metrics related to the transfer of the data between the computing device and the at least one downstream device. The testing software may also be configured to determine whether the electrical cable meets an acceptable standard of quality based on the one or more metrics.

The one or more metrics may include at least one of an error rate and a throughput rate. The testing software may be configured to fail the electrical cable if the error rate exceeds a defined threshold or the throughput rate falls outside of a defined range of values.

Determining the one or more metrics and determining whether the electrical cable meets the acceptable standard of quality may include displaying a visual diagram to a user of the testing system.

In accordance with another aspect of the present disclosure, a testing system that includes an electrical cable, a computing device, a downstream section, an upstream section, and testing software is disclosed. The downstream section may include a plurality of downstream devices, downstream signal attenuation circuitry coupled to a first portion of the electrical cable, and downstream extension cables that couple the plurality of downstream devices to the downstream signal attenuation circuitry. The upstream section may include upstream signal attenuation circuitry coupled to a second portion of the electrical cable, a communication interface coupled to the computing device, and upstream extension cables that couple the upstream signal attenuation circuitry to the communication interface. The testing software may be stored on the computing device. The testing software may be configured to initiate and evaluate transfer of data between the computing device and the plurality of downstream devices through the upstream section, the electrical cable, and the downstream section.

Each downstream device of the plurality of downstream devices may include a data reception module, a data transmission module, and an asynchronous transfer setting. The data reception module may be configured to receive the data from the computing device. The data transmission module may be configured to send the data back to the computing device. The asynchronous transfer setting may be configured to prevent any requests for retransmission of the data.

The testing system may further include a microcontroller coupled to the downstream section and to the upstream section. The microcontroller may be configured to control operation of the testing system.

The communication interface may include a plurality of communication ports and a plurality of hubs. Each hub may be configured to expand one of the plurality of communication ports.

Each hub of the plurality of hubs may be configured to set a differential voltage level for data transmission in the testing system to a value that is less than a standard differential voltage level for a communication protocol that is used in the testing system.

The electrical cable may include at least one slow-speed conductor. The downstream section may further include logic configured to perform a continuity test on the at least one slow-speed conductor.

The transfer of the data between the computing device and the plurality of downstream devices may occur in accordance with a Universal Serial Bus (USB) protocol.

The testing software may include a sequential high-speed testing module and a parallel high-speed testing module. The sequential high-speed testing module may be configured to sequentially test differential pairs within the electrical cable. The parallel high-speed testing module may be configured to test the differential pairs within the electrical cable in parallel to detect for cross-talk defects in the electrical cable.

The testing software may further include an orientation testing module and a slow-speed testing module. The orientation testing module may be configured to test whether the electrical cable is oriented properly within the testing system. The slow-speed testing module may be configured to test at least one slow-speed conductor within the electrical cable.

In accordance with another aspect of the present disclosure, a method for testing an electrical cable is disclosed. The method may include providing a testing system that includes a computing device, a communication interface coupled to the computing device, at least one downstream device, and at least one signal degradation component. The method may also include connecting the electrical cable to the testing system. The method may also include transferring data between the computing device and the at least one downstream device through the electrical cable and the at least one signal degradation component. The method may also include determining one or more metrics related to the transferring of the data. The method may also include determining whether the electrical cable meets an acceptable standard of quality based on the one or more metrics.

Determining the one or more metrics related to the transferring of the data may include determining an error rate. Determining whether the electrical cable meets the acceptable standard of quality may include determining whether the error rate exceeds a defined threshold.

Determining the one or more metrics related to the data transfer may include determining a throughput rate. Determining whether the electrical cable meets the acceptable standard of quality may include determining whether the throughput rate is within a defined range of acceptable values.

Transferring the data may include transferring the data sequentially through differential pairs within the electrical cable, one differential pair at a time. Transferring the data may also include transferring the data in parallel through the differential pairs of the electrical cable to detect for cross-talk defects in the electrical cable.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

Additional features and advantages of implementations of the disclosure will be set forth in the description that follows, and in part will be apparent from the description, or may be learned by the practice of the teachings herein. The features and advantages of such implementations may be realized and obtained by means of the instruments and combinations particularly pointed out in the appended claims. These and other features will become more fully apparent from the following description and appended claims, or may be learned by the practice of such implementations as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, similar reference numbers have been used for similar features in the various embodiments. Unless indicated otherwise, these similar features may have the same or similar attributes and serve the same or similar functions. Understanding that the drawings depict some examples of embodiments, the embodiments will be described and explained with additional specificity and detail through the use of the accompanying drawings in which.

DETAILED DESCRIPTION

As noted above, the present disclosure is related to a testing system for an electrical cable. A testing system in accordance with the present disclosure may be used to test any type of electrical cable. In some embodiments, a testing system in accordance with the present disclosure may be used to test a micro-coaxial cable or micro-coaxial cable assembly. A coaxial cable includes an inner conductor surrounded by a tubular insulating layer, further surrounded by a tubular conducting shield. Many coaxial cables also have an insulating outer sheath or jacket. Coaxial cable may be used as a transmission line for high-speed data transmission. An extremely fine coaxial cable may be referred to as a micro-coaxial cable. A set of multiple micro-coaxial cables may be ribbonized or otherwise grouped together to form a micro-coaxial cable assembly. Some computing devices being produced today use micro-coaxial cable assemblies to transfer data between circuit boards at high data transfer speeds.

Currently, equipment such as vector network analyzers and time domain reflectometry machines may be used to test the functional reliability of a micro-coaxial cable assembly. However, vector network analyzers and time domain reflectometry machines are expensive. In addition, they are relatively slow and require a significant amount of setup and calibration. They also must be operated by skilled professionals who have a good understanding of how these machines work. For these reasons, it is not practical to use vector network analyzers or time domain reflectometry machines to test micro-coaxial cable assemblies in a mass production manufacturing environment.

Advantageously, a testing system in accordance with the present disclosure may be used to quickly and reliably test micro-coaxial cable assemblies in a mass production manufacturing environment. However, the scope of the present disclosure should not be limited to micro-coaxial cables or micro-coaxial cable assemblies. As noted above, a testing system in accordance with the present disclosure may be used to test any type of electrical cable.

Figure 1:
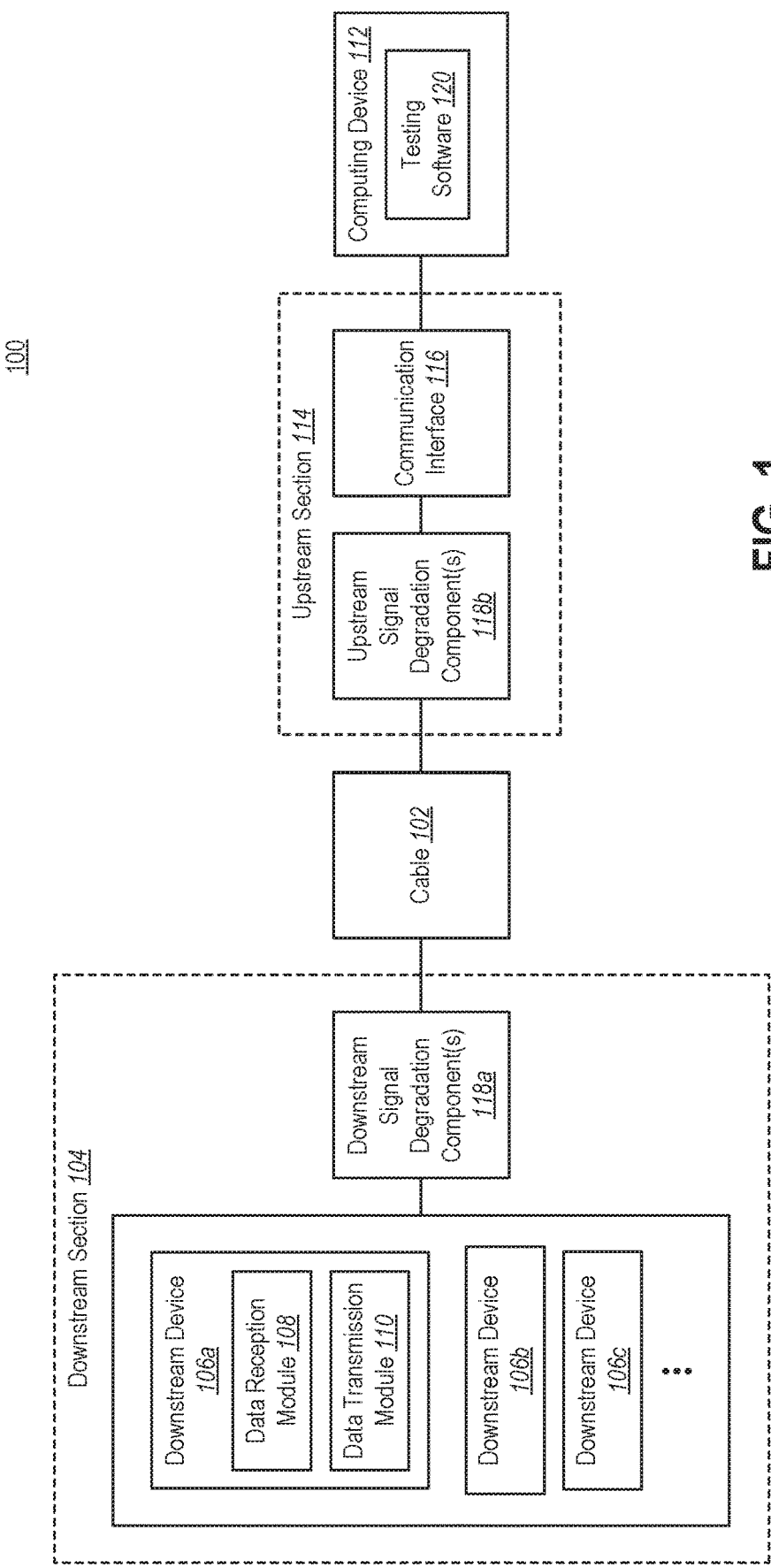
FIG. 1 illustrates an example of a testing system that may be used to test an electrical cable in accordance with the present disclosure.

FIG. 1 illustrates an example of a testing system 100 that may be used to test an electrical cable 102 in accordance with the present disclosure. In some embodiments, the electrical cable 102 may be a micro-coaxial cable or a micro-coaxial cable assembly. Alternatively, the electrical cable 102 may be a different type of electrical cable, such as a slow-speed cable, a power cable, etc. The electrical cable 102 may include a single electrical conductor or multiple electrical conductors. For simplicity, the electrical cable 102 may be referred to herein simply as a cable 102.

The testing system 100 may include a downstream section 104. The downstream section 104 may include at least one downstream device 106. Although three downstream devices 106a-c are shown in FIG. 1, a testing system 100 in accordance with the present disclosure may include a different number of downstream devices 106. In the discussion that follows, it will be assumed that the downstream section 104 includes a plurality of downstream devices 106. However, a testing system 100 in accordance with the present disclosure may include only one downstream device 106.

Each downstream device 106 may include a data reception module 108 and a data transmission module 110. For simplicity, only one downstream device 106a in FIG. 1 is shown with a data reception module 108 and a data transmission module 110, but the other downstream devices 106b-c may also include similar modules 108, 110. The data reception module 108 may be configured to receive data that is sent from a computing device 112. The data transmission module 110 may be configured to send the data back to the computing device 112.

The testing system 100 may also include an upstream section 114. The upstream section 114 may include a communication interface 116 coupled to the computing device 112.

The testing system 100 may also include one or more signal degradation components 118. More specifically, the downstream section 104 may include one or more downstream signal degradation components 118a, and the upstream section 114 may include one or more upstream signal degradation components 118b. The signal degradation components 118 may introduce loss into the testing system 100. Some communication protocols are fairly resilient and able to correct many errors. Therefore, without the signal degradation components 118, some cables 102 that do not meet a high standard of quality may receive a passing score when they are tested. By including the signal degradation components 118, enough loss may be introduced into the testing system 100 so that only cables 102 that meet a high standard of quality receive a passing score when they are tested.

Testing software 120 may be stored on the computing device 112. When the testing system 100 is being used to test a cable 102, the testing software 120 may be executed by one or more processors of the computing device 112 to control the testing of the cable 102 using the various other components in the testing system 100. The testing software 120 may initiate and evaluate transfer of data between the computing device 112 and the downstream devices 106 through the cable 102, as will be described in greater detail below.

The testing system 100 may be protocol agnostic. In some embodiments, communication between the computing device 112 and the downstream devices 106 may occur in accordance with any suitable communication protocol that facilitates high-speed data transfer. Some examples of communication protocols that may be used include the Universal Serial Bus (USB) protocol (especially USB version 2.0 or later), the Peripheral Component Interconnect Express (PCIe) protocol, and the display port protocol. Alternatively, communication in the testing system 100 may not occur in accordance with any particular protocol. For example, in some embodiments, the testing system 100 may include circuitry (e.g., a field-programmable gate array (FPGA)) that sends raw bits of data (e.g., ones and zeroes) at a very high frequency through the cable 102.

Figure 2:
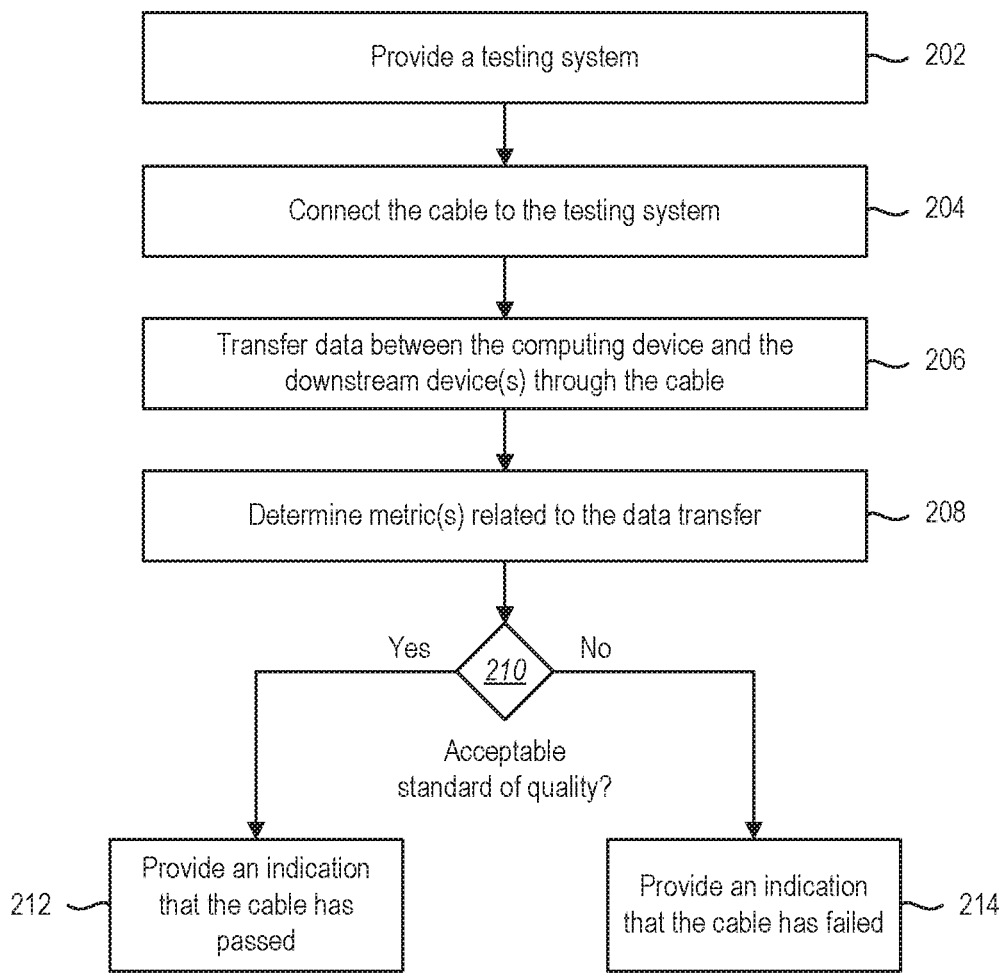
FIG. 2 illustrates an example of a method for testing an electrical cable in accordance with the present disclosure.

FIG. 2 illustrates an example of a method 200 for testing a cable 102 in accordance with the present disclosure. The method 200 will be described in relation to the testing system 100 shown in FIG. 1.

The method 200 may include providing 202 a testing system 100 that includes a computing device 112 with testing software 120, a communication interface 116 coupled to the computing device 112, and at least one downstream device 106. The testing system 100 may also include additional components, such as one or more downstream signal degradation components 118a and one or more upstream signal degradation components 118b.

In order to test a particular cable 102, the cable 102 may be connected 204 to the testing system 100. The cable 102 may be connected to the communication interface 116, either directly or via the upstream signal degradation component(s) 118b. The cable 102 may also be connected to the downstream devices 106, either directly or via the downstream signal degradation component(s) 118a.

Data may be transferred 206 between the computing device 112 and the downstream devices 106 through the cable 102. The testing software 120 on the computing device 112 may initiate transfer of data from the computing device 112 to the downstream devices 106. On its way from the computing device 112 to the downstream devices 106, the data may pass through the communication interface 116, the upstream signal degradation component(s) 118b, the cable 102, and the downstream signal degradation component(s) 118a. When the downstream devices 106 receive the data, the downstream devices 106 may send the same data back to the computing device 112. On its way from the downstream devices 106 to the computing device 112, the data may pass through the downstream signal degradation component(s) 118a, the cable 102, the upstream signal degradation component(s) 118b, and the communication interface 116.

The testing software 120 may determine 208 one or more metrics related to the transfer of data between the computing device 112 and the downstream devices 106 through the cable 102. The testing software 120 may also determine 210 whether the cable 102 meets an acceptable standard of quality based on the metric(s). If it is determined 210 that the cable 102 meets an acceptable standard of quality, the testing software 120 may provide 212 an indication that the cable 102 has passed the test. If, however, it is determined 210 that the cable 102 does not meet an acceptable standard of quality, the testing software 120 may provide 214 an indication that the cable 102 has failed the test.

Figure 3:
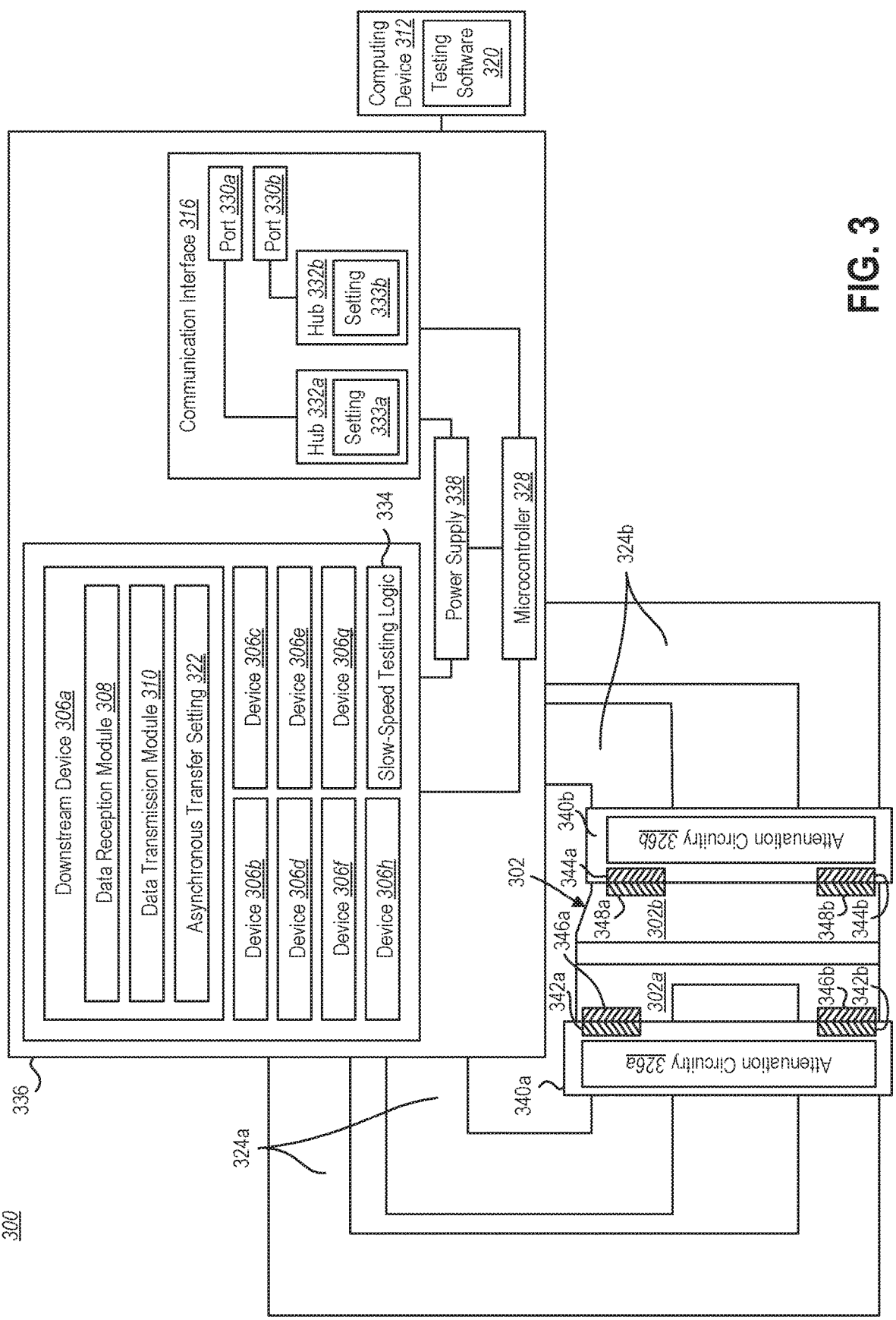
FIG. 3 illustrates another example of a testing system that may be used to test an electrical cable in accordance with the present disclosure.

FIG. 3 illustrates another example of a testing system 300 that may be used to test a cable 302 in accordance with the present disclosure. Like the testing system 100 shown in FIG. 1, the testing system 300 may include an upstream section and a downstream section. The upstream section may include a communication interface 316 coupled to a computing device 312 that runs testing software 320. The downstream section may include a plurality of downstream devices 306a-h. For simplicity, some of the downstream devices 306b-h shown in FIG. 3 are simply labeled as devices 306b-h.

Each downstream device 306 may also include an asynchronous transfer setting 322. Some communication protocols, including the USB protocol, may be configured to request a sender to resend data when errors are detected. In a testing system 300 for a cable 302, however, it may not be desirable for the sender to resend data. If the computing device 312 resends data to the downstream devices 306 (or vice versa), errors that occur due to defects in the cable 302 may be corrected. In order to test the cable 302, however, it may be preferable to count these errors rather than to correct them. The asynchronous transfer setting 322 may be a firmware/software setting that prevents any requests for retransmission of data.

For simplicity, the data reception module 308, data transmission module 310, and asynchronous transfer setting 322 are only shown in one downstream device 306a in FIG. 3. However, each of the other downstream devices 306b-h may also include similar modules 308, 310 and settings 322.

In some embodiments, the transfer of data between the computing device 312 and the downstream devices 306 may occur in accordance with the USB protocol. In such embodiments, each downstream device 306 may be configured similarly to a USB key (which may alternatively be referred to as a USB drive, a flash drive, a thumb drive, etc.). In embodiments where the USB protocol is used, each downstream device 306 may be configured to be a USB protocol emulator that facilitates USB data transfer between the computing device 312 and the downstream devices 306.

The testing system 300 may include one or more downstream signal degradation components, which may take the form of downstream extension cables 324a and downstream signal attenuation circuitry 326a. The downstream extension cables 324a may couple the downstream devices 306 to the downstream signal attenuation circuitry 326a.

The testing system 300 may also include one or more upstream signal degradation components, which may take the form of upstream extension cables 324b and upstream signal attenuation circuitry 326b. The upstream extension cables 324b may couple the upstream signal attenuation circuitry 326b to the communication interface 316. For simplicity, the downstream signal attenuation circuitry 326a and the upstream signal attenuation circuitry 326b are simply labeled as attenuation circuitry 326a, 326b in FIG. 3.

As noted above, the signal degradation components may introduce loss into the testing system 300 so that only cables 302 that meet a high standard of quality will receive a passing score when they are tested. The downstream extension cables 324a and the upstream extension cables 324b may introduce loss by increasing the length of the path that the electrical signals travel from the computing device 312 to the downstream devices 306, and vice versa. The signal attenuation circuitry 326 may include passive electrical components such as resistors and capacitors that introduce loss by attenuating the electrical signals in the testing system 300. In addition to adding attenuation to the signal, the downstream extension cables 324a may also make the testing system 300 more user friendly and manageable.

The downstream signal degradation components and the upstream signal degradation components may be configured similarly to one another so that they introduce a substantially similar amount of loss into the testing system 300. For example, the length of the downstream extension cables 324a may be substantially similar to the length of the upstream extension cables 324b. The downstream signal attenuation circuitry 326a and the upstream signal attenuation circuitry 326b may include similar electrical components (e.g., resistors, capacitors) arranged in a similar manner. Thus, the amount of loss that is introduced into the testing system 300 in the downstream section may be substantially similar to the amount of loss that is introduced into the testing system 300 in the upstream section.

The testing system 300 may include a microcontroller 328. The microcontroller 328 may be coupled to the downstream section and to the upstream section. More specifically, the microcontroller 328 may be coupled to the downstream devices 306, and also to the communication interface 316. The microcontroller 328 may control operation of the testing system 300.

The communication interface 316 may include one or more communication ports 330a-b and one or more hubs 332a-b. Each hub 332a-b may be configured to expand one of the communication ports 330a-b. In embodiments where communication between the computing device 312 and the downstream devices 306 occurs in accordance with the USB protocol, the communication ports 330a-b may be USB ports and the hubs 332a-b may be USB hubs.

The hubs 332a-b may each include an asynchronous transfer setting 333a-b. Like the asynchronous transfer setting 322 in the downstream devices 306, the asynchronous transfer setting 333a-b in the hubs 332a-b may be configured to prevent any requests for retransmission of data.

The hubs 332a-b may control the differential voltage level at which data transmission occurs in the testing system 300. If the communication protocol that is being used (e.g., USB) in the testing system 300 has a standard differential voltage level, each of the hubs 332a-b may set the differential voltage level for data transmission in the testing system 300 to a value that is lower than the standard differential voltage level. In some embodiments, the hubs 332a-b may set the differential voltage level to the minimum differential voltage level for the applicable communication protocol. Setting the differential voltage level for data transmission to a value than is lower than normal may help ensure that only cables 302 that meet a high standard of quality will receive a passing score when they are tested.

The cable 302 may include a plurality of high-speed differential pairs that may be used for transmission of high-speed data. In addition, the cable 302 may also include one or more conductors for transmitting slow-speed signals, such as general-purpose input/output (GPIO) signals. These types of conductors may be referred to herein as slow-speed conductors. The downstream section may also include logic that is configured to perform a continuity test on the slow-speed conductor(s). This logic is labeled slow-speed testing logic 334 in FIG. 3.

The downstream devices 306a-h, the communication interface 316, and the microcontroller 328 may be located on the same printed circuit board (PCB) 336. This PCB 336 may be referred to herein as the primary PCB 336. The primary PCB 336 may also include a power supply 338 that supplies power to the various components on the primary PCB 336. The testing system 300 may also include additional PCBs 340a-b that include the downstream signal attenuation circuitry 326a and the upstream signal attenuation circuitry 326b, respectively. These PCBs 340a-b may be referred to as a downstream PCB 340a and an upstream PCB 340b, respectively.

The testing system 300 may include connection points for the cable 302, i.e., places where the cable 302 may be connected to the other components within the testing system 300. The connection points for the cable 302 may take the form of receptacles 342a-b in the downstream PCB 340a and receptacles 344a-b in the upstream PCB 340b. The first portion 302a of the cable 302 may include connectors 346a-b that may be inserted into the receptacles 342a-b in the downstream PCB 340a. Similarly, the second portion 302b of the cable 302 may include connectors 348a-b that may be inserted into the receptacles 344a-b in the upstream PCB 340b.

Locating the connection points for the cable 302 someplace other than the primary PCB 336 may be advantageous because the testing system 300 may be used to test many hundreds or even thousands of cables 302. At some point, after many tests have been performed, the receptacles 342a-b, 344a-b that receive the connectors 346a-b, 348a-b on the cable 302 may eventually degrade to the point where they cannot be used any longer. When this happens, the PCBs 340a-b that include these receptacles 342a-b, 344a-b may need to be replaced. If these receptacles 342a-b, 344a-b were located on the primary PCB 336, then the primary PCB 336 would need to be replaced. However, replacing the primary PCB 336 may be wasteful and costly because other relatively expensive components may be located on the primary PCB 336 (such as the downstream devices 306, the microcontroller 328, and the communication interface 316). It may therefore be advantageous to have the receptacles 342a-b, 344a-b located on other PCBs 340a-b that are less expensive to replace.

The number of components (e.g., downstream devices 306, communication ports 330, hubs 332) shown in FIG. 3 should not be interpreted as limiting the scope of the present disclosure. In alternative embodiments a different number of downstream devices 306, communication ports 330, hubs 332, and/or other components may be used.

The testing system 300 may be used in a manufacturing setting (e.g., a mass production manufacturing setting) or a laboratory environment. The testing system 300 may be configured for use as a single-step automatic solution. In other words, the testing system 300 may be configured so that the user/operator merely has to perform a single step (such as pressing a button) in order to test a particular cable 302. Alternatively, the testing system 300 may be configured so that the user/operator performs multiple steps during the testing process.

Figure 4:
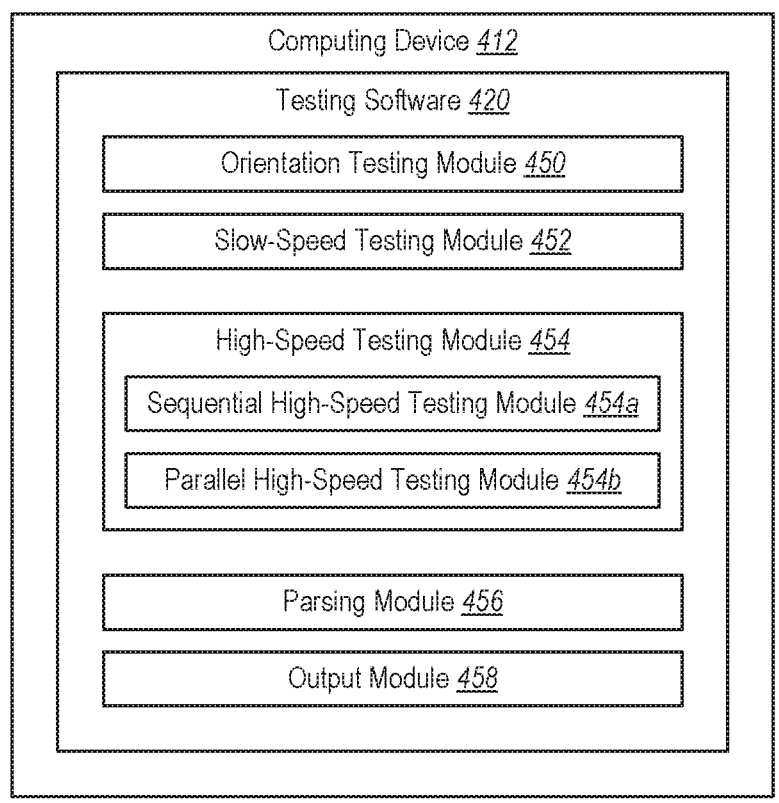
FIG. 4 illustrates an example of various modules that may be included in testing software running on a computing device.

FIG. 4 illustrates an example of various modules that may be included in testing software 420 running on a computing device 412. These modules may include an orientation testing module 450, a slow-speed testing module 452, a high-speed testing module 454, a parsing module 456, and an output module 458.

The orientation testing module 450 may be configured to test whether the cable 302 is oriented properly within the testing system 300. If the cable 302 is not oriented properly, the orientation testing module 450 may cause the output module 458 to output an indication that the orientation should be changed.

The slow-speed testing module 452 may be configured to test any slow-speed conductors within the cable 302. For example, the slow-speed testing module 452 may cause the slow-speed testing logic 334 to perform a continuity test on the slow-speed conductor(s) within the cable 302 by using a common sequential continuity test known as running ones and running zeroes.

The high-speed testing module 454 may test differential pairs within the cable 302 that are capable of transmitting data at high speeds. The high-speed testing module 454 may include a sequential high-speed testing module 454a and a parallel high-speed testing module 454b. The sequential high-speed testing module 454a may be configured to sequentially test the high-speed differential pairs within the cable 302. The sequential high-speed testing module 454a may cause data to be sent through the differential pairs in the cable 302 sequentially, one differential pair at a time. The parallel high-speed testing module 454b may be configured to test the high-speed differential pairs within the cable 302 in parallel. The parallel high-speed testing module 454b may cause data to be sent through all of the differential pairs within the cable 302 in parallel. One advantage of the parallel high-speed testing module 454b is allowing the testing system 300 to detect cross-talk defects within the cable 302.

As noted above, when a downstream device 306 receives data from the computing device 412, the downstream device 306 may send the data back to the computing device 412. The parsing module 456 may parse the data that is received from the downstream devices 306 and compare it with the data that was initially sent to determine errors.

Based on the results of the various tests that may be performed by the testing system 300, the output module 458 may output an indication of whether the cable 302 has passed or failed. The output module 458 may output an indication of failure if the cable 302 fails the slow-speed test performed by the slow-speed testing module 452, the sequential high-speed test performed by the sequential high-speed testing module 454a, or the parallel high-speed test performed by the parallel high-speed testing module 454b. If the cable 302 passes all of these tests, then the output module 458 may output an indication that the cable 302 has passed.

Figure 5:
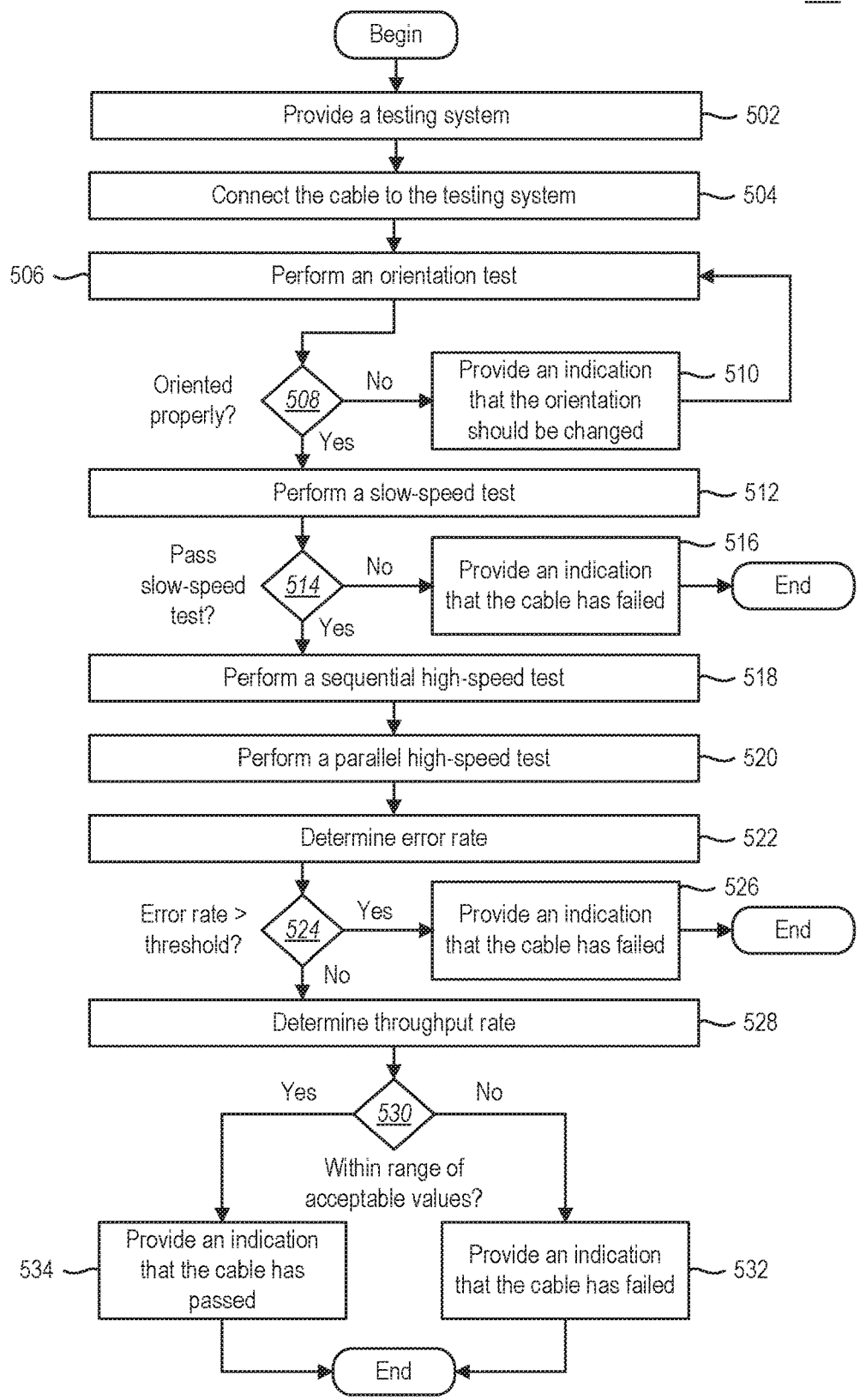
FIG. 5 illustrates another example of a method for testing an electrical cable in accordance with the present disclosure.

FIG. 5 illustrates another example of a method 500 for testing a cable 302 in accordance with the present disclosure. The method 500 will be described in relation to the testing system 300 shown in FIG. 3 and the testing software 420 shown in FIG. 4.

The method 500 may include providing 502 a testing system 300 that includes a computing device 312, a communication interface 316 coupled to the computing device 312, and a plurality of downstream devices 306. The testing system 300 may also include additional components, such as extension cables 324a-b and signal attenuation circuitry 326a-b.

In order to test a particular cable 302, the cable 302 may be connected 504 to the testing system 300. A first portion 302a of the cable 302 may be connected to the downstream signal attenuation circuitry 326a. For example, connectors 346a-b within the cable 302 may be inserted into receptacles 342a-b on a PCB 340a that includes the downstream signal attenuation circuitry 326a. A second portion 302b of the cable 302 may be connected to the upstream signal attenuation circuitry 326b. For example, connectors 348a-b within the cable 302 may be inserted into receptacles 344a-b on a PCB 340b that includes the upstream signal attenuation circuitry 326b.

An orientation test may be performed 506 in order to determine whether the cable 302 is oriented properly within the testing system 300. If it is determined 508 that the cable 302 is not oriented properly, an indication may be provided 510 that the orientation should be changed.

A slow-speed test may be performed 512 in order to test any slow-speed conductors within the cable 302. For example, a continuity test may be performed on the slow-speed conductor(s). If it is determined 514 that the cable 302 does not pass the slow-speed test, then an indication may be provided 516 that the cable 302 has failed (i.e., that the cable 302 does not meet an acceptable standard of quality).

If it is determined 514 that the cable 302 passes the slow-speed test, a sequential high-speed test may then be performed 518. During the sequential high-speed test, data may be transferred sequentially through the high-speed differential pairs within the cable 302, one differential pair at a time. A parallel high-speed test may also be performed 520, in which data may be transferred in parallel through the high-speed differential pairs within the cable 302. For both the sequential and the parallel high-speed tests, the testing software 420 may initiate data transfer from the computing device 312 to the downstream devices 306 (through the communication interface 316, the upstream extension cables 324*b*, the upstream signal attenuation circuitry 326*b*, the cable 302, the downstream signal attenuation circuitry 326*a*, and the downstream extension cables 324*a*). When the downstream devices 306 receive the data, the downstream devices 306 may send the same data back to the computing device 312 (through the downstream extension cables 324*a*, the downstream signal attenuation circuitry 326*a*, the cable 302, the upstream signal attenuation circuitry 326*b*, the upstream extension cables 324*b*, and the communication interface 316).

One or more metrics related to the sequential high-speed test and the parallel high-speed test may be determined. For example, an error rate may be determined 522 for the data transfer between the computing device 312 and the downstream devices 306. The parsing module 456 of the testing software 420 may compare the data that the computing device 312 sends to the downstream devices 306 with the data that the computing device 312 receives from the downstream devices 306 to determine 522 the error rate. If it is determined 524 that the error rate exceeds a defined threshold, then an indication may be provided 526 that the cable 302 has failed.

In some embodiments, separate error rates may be determined for the sequential high-speed test and the parallel high-speed test. Separate thresholds may be determined as well. The cable 302 may be failed if the error rate for the sequential high-speed test exceeds the defined threshold for the sequential high-speed test or the error rate for the parallel high-speed test exceeds the defined threshold for the parallel high-speed test. Alternatively, an aggregate error rate may be determined for both the sequential high-speed test and the parallel high-speed test. This aggregate error rate may be compared to a single threshold.

A throughput rate may be determined 528 for the data transfer between the computing device 312 and the downstream devices 306. If it is determined 530 that the throughput rate is outside of a defined range of acceptable values, then an indication may be provided 532 that the cable 302 has failed. In some embodiments, separate throughput rates may be determined for the sequential high-speed test and the parallel high-speed test.

If it is determined 524 that the error rate does not exceed the defined threshold(s) and it is also determined 530 that the throughput rate is within the defined range of acceptable values, then an indication may be provided 534 that the cable 302 has passed. The cable 302 may then be considered to have met an acceptable standard of quality and may be used in the production of commercial products.

The error rate and the throughput rate are examples of metrics related to the transfer of data between the computing device 312 and the downstream devices 306. However, these examples should not be interpreted as limiting the scope of the present disclosure; other metrics may be used instead of or in addition to the error rate and/or the throughput rate. In some embodiments, the testing system 300 may create a visual diagram, such as an eye diagram, and display the visual diagram to the user of the testing system 300. The visual diagram may have a pass-fail mask on it to determine the quality of the cable 302. The visual diagram may be displayed on the computing device 312.

Figure 6:
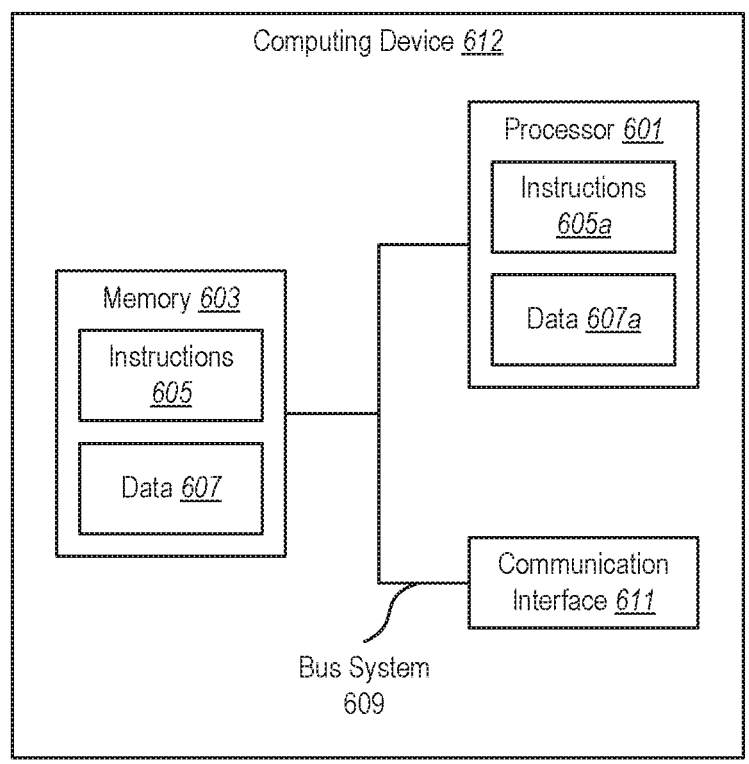
FIG. 6 illustrates certain components that may be included within a computing device.

FIG. 6 illustrates certain components that may be included within a computing device 612. The computing device 612 is an example of the computing devices 112, 312, 412 that have been discussed previously.

The computing device 612 includes a processor 601. The processor 601 may be a general purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 601 may be referred to as a central processing unit (CPU). Although just a single processor 601 is shown in the computing device 612 of FIG. 6, in an alternative configuration, a combination of processors (e.g., an ARM and DSP) could be used.

The computing device 612 also includes memory 603. The memory 603 may be any electronic component capable of storing electronic information. For example, the memory 603 may be embodied as random access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 605 and data 607 may be stored in the memory 603. The instructions 605 may be executable by the processor 601 to implement some or all of the methods disclosed herein. Executing the instructions 605 may involve the use of the data 607 that is stored in the memory 603. When the processor 601 executes the instructions 605, various portions of the instructions 605*a* may be loaded onto the processor 601, and various pieces of data 607*a* may be loaded onto the processor 601.

Any of the various examples of modules and components that have been described in relation to a computing device 612 (such as the testing software 120, 320, 420, the orientation testing module 450, the slow-speed testing module 452, the high-speed testing module 454, the sequential high-speed testing module 454*a*, the parallel high-speed testing module 454*b*, the parsing module 456, the output module 458, etc.) may be implemented, partially or wholly, as instructions 605 stored in memory 603 and executed by the processor 601. Any of the various examples of data described herein (such as the data that a computing device 612 sends to downstream devices 106, 306, the threshold(s) for error rate(s), the range of acceptable values for the throughput, etc.) may be among the data 607 that is stored in memory 603 and used during execution of the instructions 605 by the processor 601.

The computing device 612 may also include a communication interface 611. The communication interface 611 may be configured to communicate with a communication interface 116, 316 that is part of the upstream section 114 of a testing system 100, 300. Communication between the communication interface 611 of the computing device 612 and the communication interface 116, 316 within the upstream section 114 of a testing system 100, 300 may occur in accordance with any suitable communication protocol that facilitates high-speed data transfer, such as USB, PCIe, display port, etc.

The various components of the computing device 612 may be coupled together by one or more buses, which may include a power bus, a control signal bus, a status signal bus, a data bus, etc. For the sake of clarity, the various buses are illustrated in FIG. 6 as a bus system 609.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium comprising instructions that, when executed by at least one processor, perform one or more of the methods described herein. The instructions may be organized into routines, programs, objects, components, data structures, etc., which may perform particular tasks and/or implement particular data types, and which may be combined or distributed as desired in various embodiments.

The steps and/or actions of the methods described herein may be interchanged with one another without departing from the scope of the claims. In other words, unless a specific order of steps or actions is required for proper operation of the method that is being described, the order and/or use of specific steps and/or actions may be modified without departing from the scope of the claims.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

As used herein, the terms "coupled" and "connected" refer to components being in electrical communication with each other and/or mechanically affixed to each other, depending on the context, whether directly (i.e., without any intermediate components) or indirectly (i.e., via one or more intermediate components).

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words "means for" appear together with an associated function. Each addition, deletion, and modification to the embodiments that falls within the meaning and scope of the claims is to be embraced by the claims.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A testing system, comprising:
   an electrical cable;
   a computing device;
   a communication interface coupled to the computing device;
   at least one upstream signal degradation component coupled to the electrical cable and to the communication interface;
   at least one downstream device;
   at least one downstream signal degradation component coupled to the electrical cable and to the at least one downstream device; and
   testing software stored on the computing device, the testing software being configured to:
      initiate a test of the electrical cable by transferring data between the computing device and the at least one downstream device through the electrical cable and the communication interface;
      determine an error rate related to the transferring of the data between the computing device and the at least one downstream device; and
      determine whether the electrical cable passes the test based at least in part on the error rate.

2. The testing system of claim 1, wherein the at least one downstream device comprises:
   a data reception module configured to receive the data from the computing device; and
   a data transmission module configured to send the data back to the computing device.

3. The testing system of claim 1, wherein:
   the at least one upstream signal degradation component comprises upstream signal attenuation circuitry and upstream extension cables; and
   the at least one downstream signal degradation component comprises downstream signal attenuation circuitry and downstream extension cables.

4. The testing system of claim 1, wherein:
   the testing software is configured to initiate transfer of the data from the computing device to the at least one downstream device through the communication interface, the at least one upstream signal degradation component, the electrical cable, and the at least one downstream signal degradation component; and the at least one downstream device is configured to receive the data from the computing device and send the data back to the computing device through the at least one downstream signal degradation component, the electrical cable, the at least one upstream signal degradation component, and the communication interface.

5. The testing system of claim 1, wherein:

the testing software is configured to determine one or more metrics related to the transfer of the data between the computing device and the at least one downstream device; and the testing software is configured to determine whether the electrical cable passes the test based on the one or more metrics.

6. The testing system of claim 1, wherein:

the testing software is additionally configured to determine a throughput rate related to the transferring of the data between the computing device and the at least one downstream device; and the testing software is configured to fail the electrical cable if the error rate exceeds a defined threshold or the throughput rate falls outside of a defined range of values.

7. The testing system of claim 5, wherein determining the one or more metrics and determining whether the electrical cable passes the test comprises displaying a visual diagram to a user of the testing system.

8. A testing system, comprising:

an electrical cable;

a computing device;

a downstream section comprising a plurality of downstream devices, downstream signal attenuation circuitry coupled to a first portion of the electrical cable, and downstream extension cables that couple the plurality of downstream devices to the downstream signal attenuation circuitry;

an upstream section comprising upstream signal attenuation circuitry coupled to a second portion of the electrical cable, a communication interface coupled to the computing device, and upstream extension cables that couple the upstream signal attenuation circuitry to the communication interface; and testing software stored on the computing device, the testing software being configured to:

initiate a test of the electrical cable by transferring data between the computing device and the plurality of downstream devices through the upstream section, the electrical cable, and the downstream section;

determine an error rate related to the transferring of the data between the computing device and the plurality of downstream devices; and determine whether the electrical cable passes the test based at least in part on the error rate.

9. The testing system of claim 8, wherein each downstream device of the plurality of downstream devices comprises:

a data reception module configured to receive the data from the computing device;

a data transmission module configured to send the data back to the computing device; and an asynchronous transfer setting configured to prevent any requests for retransmission of the data.

10. The testing system of claim 8, further comprising a microcontroller coupled to the downstream section and to the upstream section, the microcontroller being configured to control operation of the testing system.

11. The testing system of claim 8, wherein the communication interface comprises:

a plurality of communication ports; and a plurality of hubs, each hub being configured to expand one of the plurality of communication ports.

12. The testing system of claim 11, wherein each hub of the plurality of hubs is configured to set a differential voltage level for data transmission in the testing system to a value that is less than a standard differential voltage level for a communication protocol that is used in the testing system.

13. The testing system of claim 8, wherein:

the electrical cable comprises at least one slow-speed conductor; and the downstream section further comprises logic configured to perform a continuity test on the at least one slow-speed conductor.

14. The testing system of claim 8, wherein the transfer of the data between the computing device and the plurality of downstream devices occurs in accordance with a Universal Serial Bus (USB) protocol.

15. The testing system of claim 8, wherein the testing software comprises:

a sequential high-speed testing module that is configured to sequentially test differential pairs within the electrical cable; and a parallel high-speed testing module that is configured to test the differential pairs within the electrical cable in parallel to detect for cross-talk defects in the electrical cable.

16. The testing system of claim 15, wherein the testing software further comprises:

an orientation testing module that is configured to test whether the electrical cable is oriented properly within the testing system; and a slow-speed testing module that is configured to test at least one slow-speed conductor within the electrical cable.

* * * * *